US006818984B2

(12) United States Patent
Kautz et al.

(10) Patent No.: US 6,818,984 B2
(45) Date of Patent: Nov. 16, 2004

(54) PROGRAMMABLE MULTI-CHIP MODULE

(75) Inventors: David Kautz, Lenexa, KS (US);
Howard Morgenstern, Lee's Summit, MO (US); Roy J. Blazek, Overland Park, KS (US)

(73) Assignee: Honeywell Federal Manufacturing & Technologies, Kansas City, MO (US)

(*) Notice: Subject to any disclaimer, the term of this patent is extended or adjusted under 35 U.S.C. 154(b) by 0 days.

(21) Appl. No.: 10/697,442

(22) Filed: Oct. 30, 2003

(65) Prior Publication Data

US 2004/0119160 A1 Jun. 24, 2004

Related U.S. Application Data

(62) Division of application No. 10/253,851, filed on Sep. 23, 2002, now Pat. No. 6,700,196.

(51) Int. Cl.⁷ .......................... H01L 23/15; H01L 23/12
(52) U.S. Cl. ....................... 257/723; 257/724; 257/703; 257/704
(58) Field of Search .................................. 257/723, 724, 257/703, 704

(56) References Cited

U.S. PATENT DOCUMENTS

| | | | | |
|---|---|---|---|---|
| 3,996,457 A | * | 12/1976 | Gabriel | 708/800 |
| 5,136,468 A | * | 8/1992 | Wong et al. | 361/683 |
| 5,471,099 A | * | 11/1995 | Larabell et al. | 307/53 |
| 6,126,458 A | * | 10/2000 | Gregory et al. | 439/76.2 |

\* cited by examiner

Primary Examiner—Jasmine Clark
(74) Attorney, Agent, or Firm—Hovey Williams LLP

(57) ABSTRACT

A multi-chip module comprising a low-temperature co-fired ceramic substrate having a first side on which are mounted active components and a second side on which are mounted passive components, wherein this segregation of components allows for hermetically sealing the active components with a cover while leaving accessible the passive components, and wherein the passive components are secured using a reflow soldering technique and are removable and replaceable so as to make the multi-chip module substantially programmable with regard to the passive components.

26 Claims, 4 Drawing Sheets

PROGRAMMABLE MULTI-CHIP MODULE

RELATED APPLICATIONS

The present application is a continuation of an earlier-filed, U.S. non-provisional patent application titled PROGRAMMABLE MULTI-CHIP MODULE, Ser. No. 10/253,851, filed Sep. 23, 2002 U.S. Pat. No. 6,700,196. The present application claims priority benefit of the identified application, and hereby incorporates the identified application by reference.

FEDERALLY SPONSORED RESEARCH OR DEVELOPMENT PROGRAM

The present invention was developed with support from the U.S. government under Contract No. DE-AC04-01AL66850 with the U.S. Department of Energy. Accordingly, the U.S. government has certain rights in the present invention.

BACKGROUND OF THE INVENTION

1. Field of the Invention

The present invention relates broadly to multi-chip modules and other similar electronic microcircuitry and methods of manufacturing the same. More particularly, the present invention concerns a multi-chip module comprising a low-temperature co-fired ceramic substrate having a first side on which are mounted active components and a second side on which are mounted passive components, wherein this segregation of components allows for hermetically sealing the active components with a cover while leaving accessible the passive components, and wherein the passive components are secured using a reflow soldering technique and are removable and replaceable so as to make the multi-chip module substantially programmable with regard to the passive components.

2. Description of the Prior Art

Many electronic systems include microcircuits designed for a specific product application. Unfortunately, both the active components and the passive components of such a microcircuit must typically be irreversibly committed to a particular design early in the microcircuit's development cycle. As a result, if one or more of these components of the original design do not produce desired results, a new design cycle must be initiated.

A multi-chip module (MCM) is a type of microcircuit, and typically includes a number of active components, such as, for example, integrated circuits (ICs), transistors, and diodes, and a number of passive surface mount components, such as, for example, capacitors, resistors, inductors, or memory modules, electrically interconnected with high-density lines. The active components are typically interconnected by wire bonding to ceramic substrates (MCM-C), laminate substrates (MCM-L), or deposited thin film substrates (MCM-D). Both the active and the passive components are typically mounted on one side of the substrate so as to be intermingled in a non-segregated manner, and then hermetically sealed beneath a cover.

Unfortunately, prior art MCMs suffer from a number of problems and disadvantages, including, as mentioned, that both the active and the passive components, being sealed beneath the cover, are substantially inaccessible. As a result, where the design is later determined to be flawed, the MCMs cannot be modified to a new design and must be discarded. Furthermore, intermingling the active and the passive components can result in longer electrical interconnections which results in a correspondingly slower processing speed.

Due to the above-identified and other problems and disadvantages in the art, a need exists for an improved microcircuit that better facilitates efficient and convenient design, testing, and modification.

SUMMARY OF THE INVENTION

The present invention overcomes the above-described and other problems and disadvantages in the prior art with an MCM manufactured so as to allow for substantial programmability in that at least some of a plurality of components of the MCM are and remain removable and replaceable throughout the design and testing process.

In a preferred embodiment, the MCM broadly comprises a substrate; one or more active components; a cover; and one or more passive components. The substrate is a low-temperature co-fired ceramic (LTCC) substrate, and presents a first side and a second side. The active components can include ICs, transistors, and diodes and are wire bonded to the first side of the substrate. The cover protects the mounted active components by hermetically sealing over them. The passive components are, for example, capacitors, resistors, inductors, or memory modules, and are reflow soldered to the second side of the substrate. Thus, the passive components are not hermetically sealed under the cover, and therefore remain accessible.

The active and the passive components are electrically interconnected with vias or through-holes in the substrate or with edge connectors. Because the active and the passive components are not mounted or otherwise secured in an intermingled and non-segregated manner on the same side of the substrate, the electrical interconnections between the active components are not required to avoid the passive components or otherwise be longer than absolutely necessary and can therefore be made shorter than is typically possible in prior art MCMs. These shorter interconnections advantageously result in correspondingly improved performance.

The described MCM can be designed, tested, and modified as follows. First, an interconnection network is fabricated on the substrate. Then the active components are attached and wire bonded to the first side of the substrate. Next, the active components are hermetically sealed under the cover. Then the passive components are mounted to the second side of the substrate using a reflow soldering technique which allows for removing and replacing the passive components as desired. Next, the MCM is tested for a desired performance. Lastly, as desired, certain of the passive components can be removed and replaced using conventional solder reworking techniques so as to achieve the desired performance. With special test fixtures, the passive components can be left off the MCM, and the MCM can be functionally tested. Passive components can then be selected and attached to the MCM for a specific circuit design.

Thus, it will be appreciated that the present invention provides a number of substantial advantages over the prior art, including, for example, segregating the passive components from the hermetically sealed active components, thereby facilitating removal and replacement of the passive components and making the MCM substantially programmable. This advantageous ability allows developers to test a variety of component values prior to committing to a finalized design, thereby shortening total design cycle time by minimizing circuit redesign and rebuild time. Furthermore, this segregation of components facilitates shorter electrical interconnections to result in correspondingly improved performance for the active components.

These and other important features of the present invention are more fully described in the section titled DETAILED DESCRIPTION OF A PREFERRED EMBODIMENT, below.

BRIEF DESCRIPTION OF THE DRAWINGS

A preferred embodiment of the present invention is described in detail below with reference to the attached drawing figures, wherein:

FIG. 4b is a continuation of the low level flow chart of FIG. 4a.

DETAILED DESCRIPTION OF A PREFERRED EMBODIMENT

Figure 1:
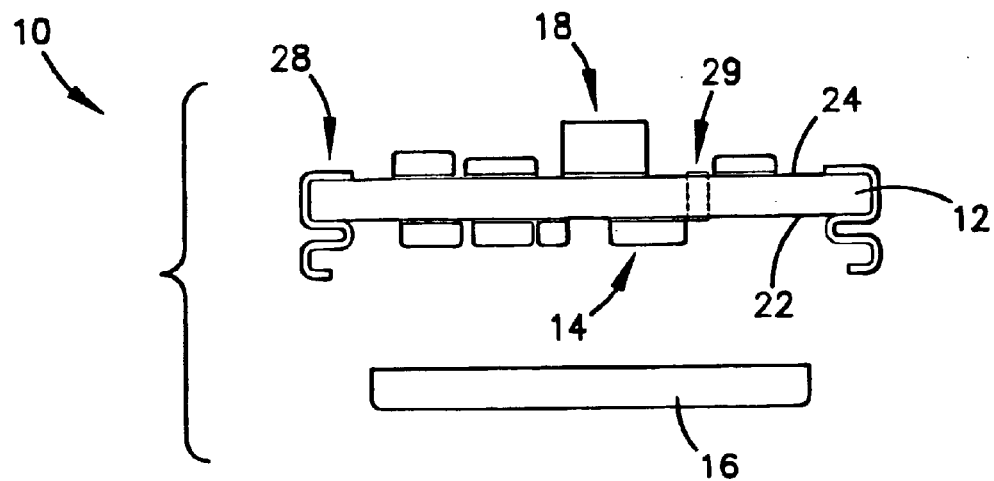
FIG. 1 is an exploded elevation view of an MCM constructed in accordance with a preferred embodiment of the present invention.
Figure 2:
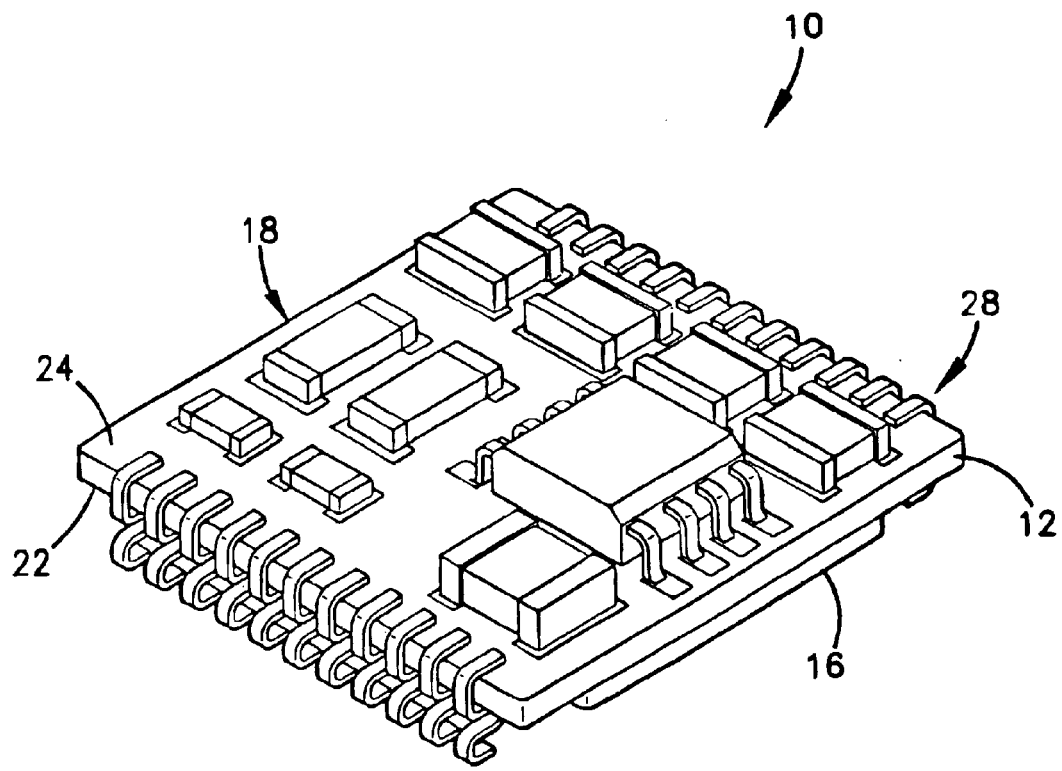
FIG. 2 is an isometric view of the MCM of FIG. 1.

Referring to FIG. 1, an MCM 10 is shown constructed in accordance with a preferred embodiment of the present invention. The MCM 10 is manufactured so as to allow for a substantial degree of programmability in that at least some of the components of the MCM 10 are and remain removable and replaceable through the design and testing process.

As illustrated, the MCM 10 broadly comprises a substrate 12; one or more active components 14; a cover 16; and one or more passive components 18. The substrate 10 provides a mounting structure having particular desired electrical, mechanical, and other characteristics, and is preferably a low-temperature co-fired ceramic substrate. The substrate 10 presents a first substantially planar side 22 and a second substantially planar side 24.

The one or more active components 14 are electrically active components, such as, for example, ICs. The active components 14 are mounted or otherwise secured, such as, for example, by wire bonding, to the first side 22 of the substrate 10. The cover 16 is a substantially conventional mechanism for protecting the mounted active components 14 from environmental extremes and solder flux. In a conventional manner, the cover 16 is hermetically sealed to the substrate 10 over the active components 14.

The one or more passive components 18 are electrically passive components, such as, for example, capacitors, resistors, inductors, or memory modules. The passive components 18 are removably and replacably mounted or otherwise secured, such as, for example, by surface mounting using a reflow soldering technique, to the second side 24 of the substrate 10. Thus, the passive components 18 are not hermetically sealed under the cover 16 with the active components 14, and therefore remain more easily accessible.

The aforementioned reflow soldering technique is a well-known technique for achieving a metal-to-metal joining. In a typical reflow soldering process, solder is first applied or otherwise interposed between solder sites of metal members to be joined. A heating element is then used to apply heat to the soldering sites, thereby melting the solder. The heating element is then removed and the solder allowed to solidify, thereby physically and electrically joining the metal members. Reflow soldering has been used extensively in the fabrication and mounting of electronic components.

The active and the passive components 14,18 are electrically and otherwise operatively interconnected using one or more edge connectors 28 or vias 29 or other through-holes provided in the substrate 10. Because the active and the passive components 14,18 are not mounted or otherwise secured so as to be intermingled and non-segregated on the same side of the substrate 10, the electrical interconnections between the active components 14 are not required to avoid the passive components 18 or otherwise be longer than absolutely required, and can therefore be made shorter than is typically possible in prior art MCMs. These shorter interconnections advantageously result in correspondingly improved performance.

Figure 3:
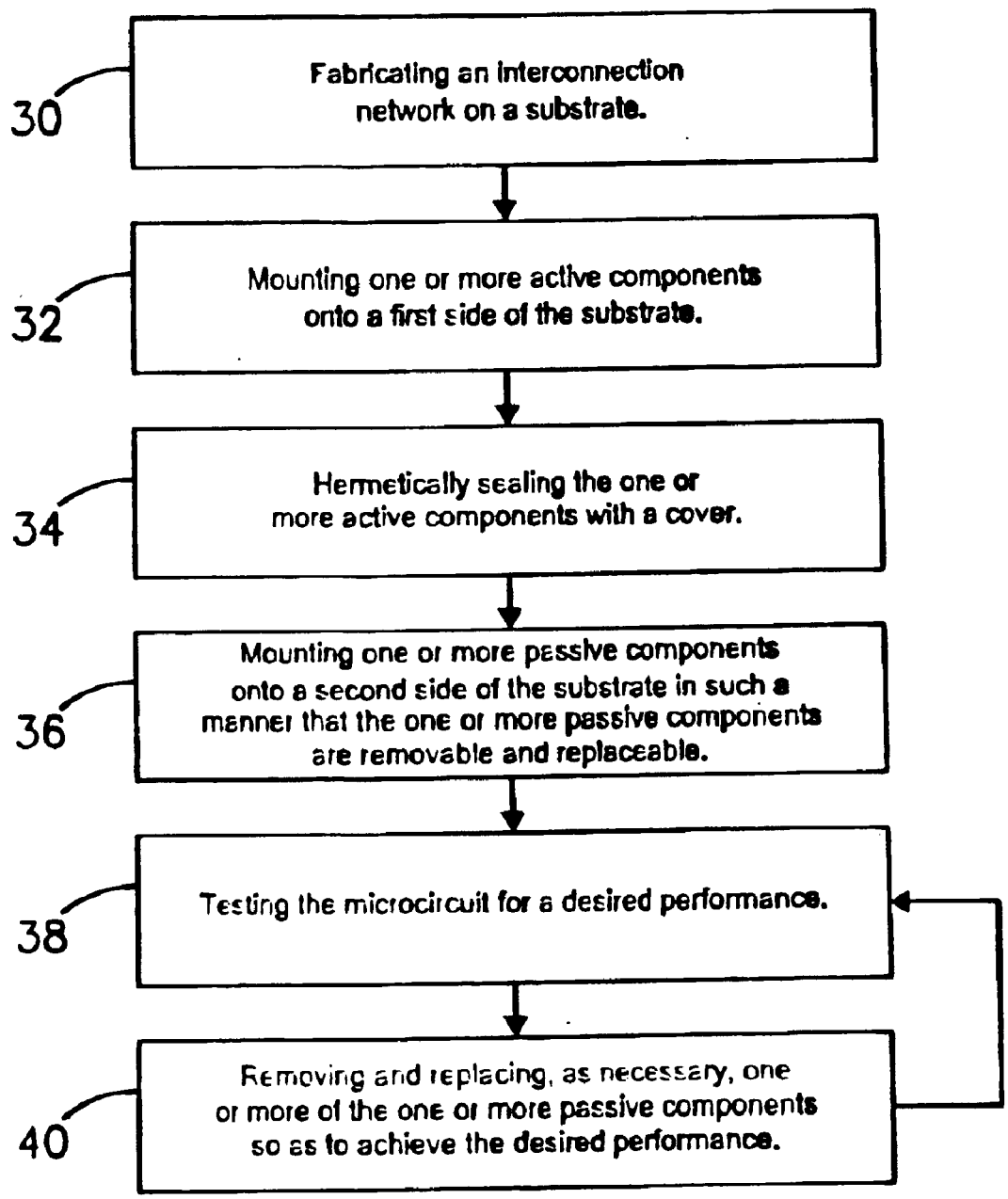
FIG. 3 is a high level flow chart of steps involved in manufacturing the MCM of FIG. 1.

Referring also to FIG. 3, manufacturing the MCM 10 proceeds as follows. First, an interconnection network is fabricated on the substrate 10 (as represented by box 30); then the active components 14 are mounted to the first side 22 of the substrate 10 (box 32); next, the active components 14 are hermetically sealed under the cover 16 (box 34); then the passive components 16 are mounted to the second side 24 of the substrate 10 in a manner allowing them to be removed and replaced as desired or necessary (box 36); next the MCM 10 is tested for a desired performance (box 38); and lastly, as necessary, certain of the passive components 18 are removed and replaced so as to achieve the desired performance (box 40). When such removal and replacement is performed, the step of testing (box 38) may be repeated.

Figure 4A:
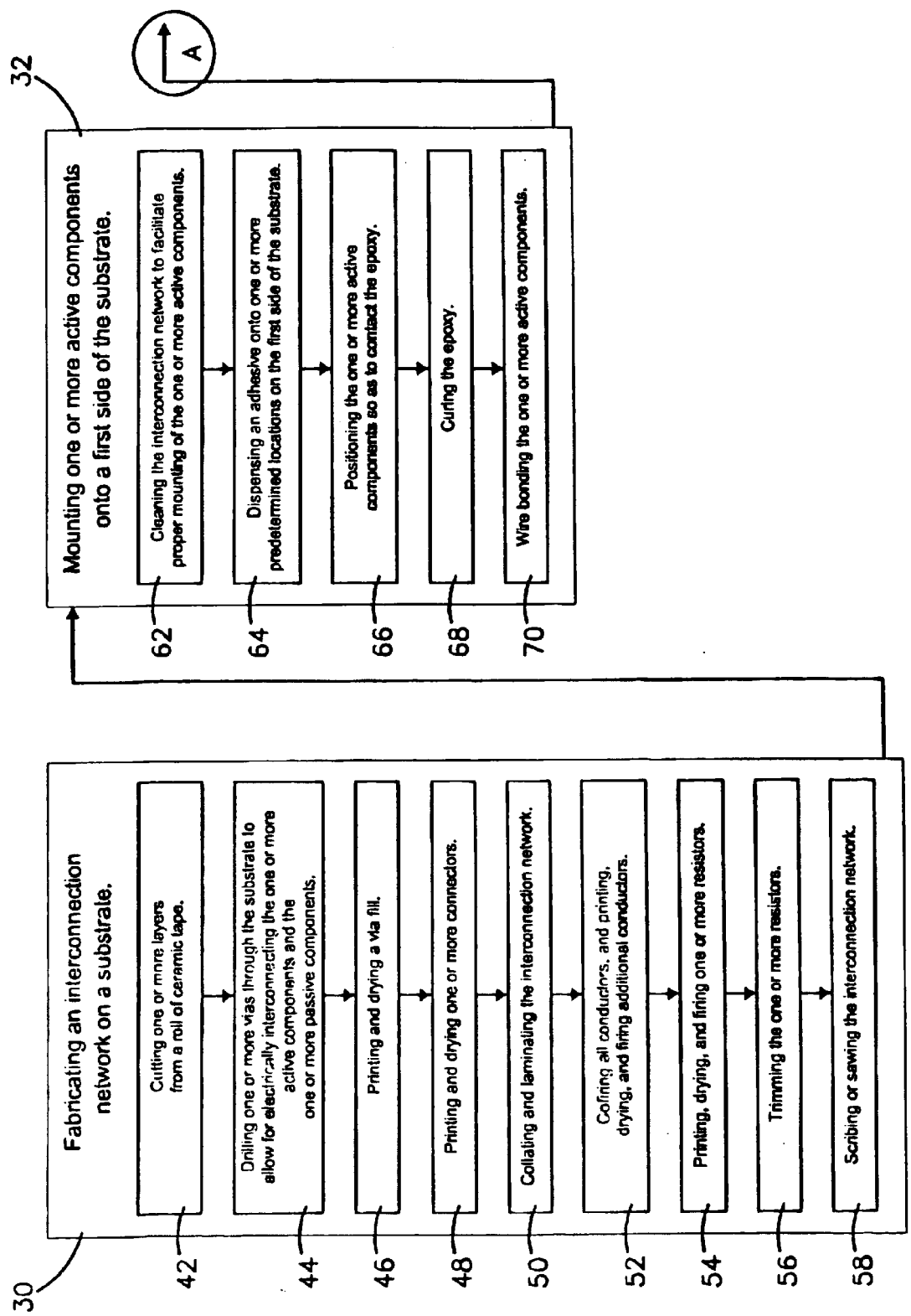
FIG. 4a is a low level flow chart of steps involved in manufacturing the MCM of FIG. 1.
Figure 4B:
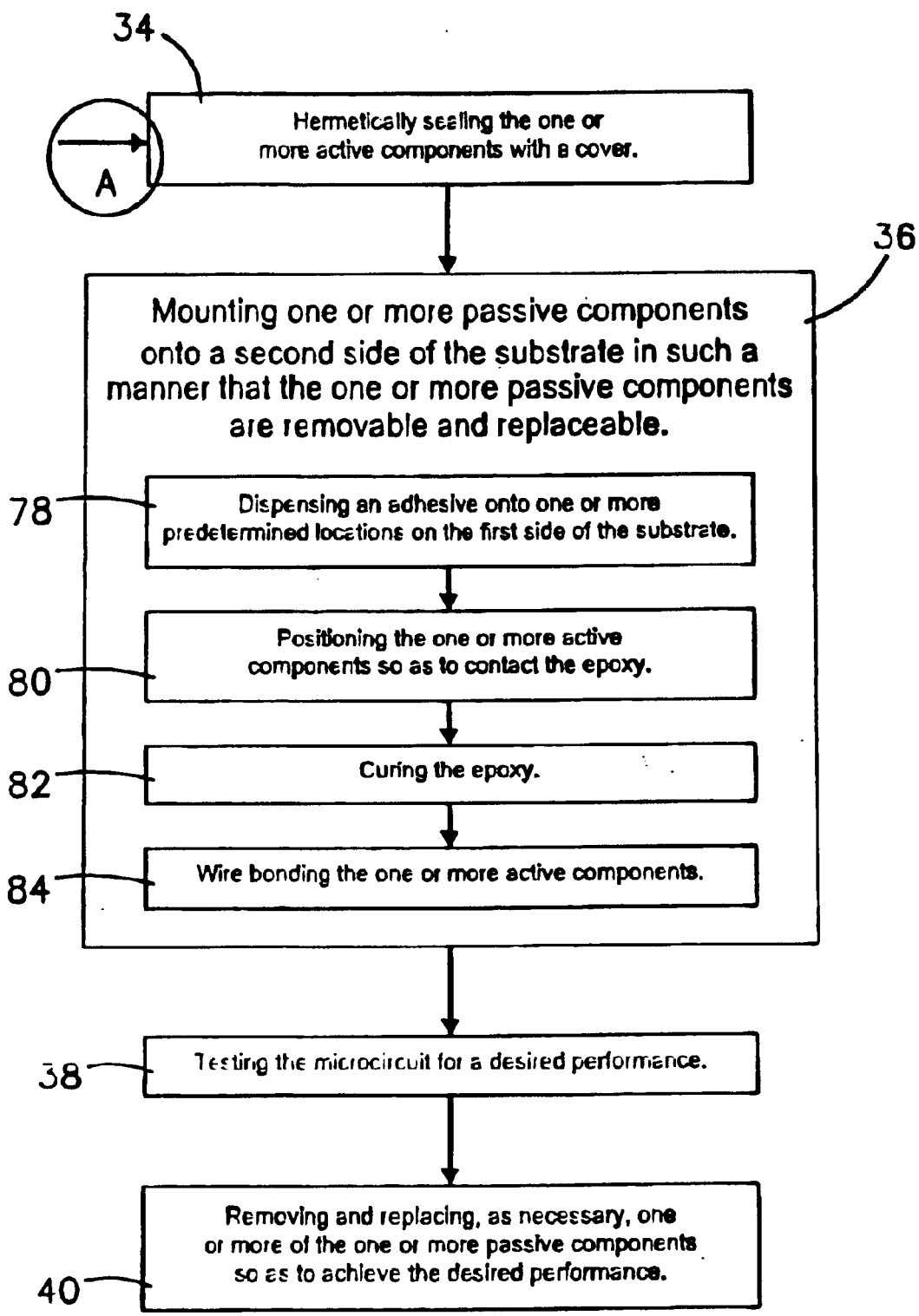

In greater detail, referring also to FIGS. 4a and 4b, the step of fabricating the interconnection network (box 30) proceeds as follows. First, tape layers are cut from a roll of the LTCC substrate material (box 42). Then vias are formed in the substrate material so as to allow for electrically interconnecting the first and second sides 22,24 of the substrate 10 (box 44). Next, via fill is printed and dried (box 46), and connectors are printed and dried (box 48). Then the layers of the interconnection network are collated and laminated (box 50). Next, all the conductors are cofired and additional conductors are printed, dried, and fired (box 52), and the resistors are printed, dried, and fired (box 54). Then the resistors are laser trimmed to specific values (box 56). Lastly, the interconnection network is laser scribed or sawed (box 58).

The step of mounting the active components 14 to the first side 22 of the substrate 10 (box 32) proceeds as follows. First, the interconnection network is cleaned to facilitate proper mounting (box 62). Then an adhesive, such as, for example, epoxy, is dispensed on appropriate locations on the first side 22 (box 64). Next, the active components 14 are positioned, such as, for example, by pick-and-place automation, so as to contact the epoxy (box 66). Then the epoxy is allowed time to cure (box 68). Next, the active components 14 are wire bonded (box 70). Thereafter, the cover 16 is positioned and hermetically sealed over the mounted active components 14 (box 34).

The step of mounting the passive components 18 to the second side 24 of the substrate 10 (box 36) proceeds as follows. First, the solder is dispensed onto the soldering sites (box 78). The solder may be, for example, 63/37 SnPb solder. Then the passive components 18 are positioned such as, for example, by pick-and-place automation, over the solder (box 80). Next, the solder is reflowed (box 82), such as, for example, by positioning the MCM 10 in a conveyorized convection reflow oven which first preheats the MCM 10 and the properly positioned active and the passive components 14,18 and then heats to 220° C. to melt the solder and secure the passive components 18 to the MCM 10. Then the MCM 10 is cleaned (box 84), particularly of solder flux residues. Lastly, the MCM 10 is tested for proper electrical operation.

Thereafter, any inoperative, improperly positioned, or otherwise undesired passive components 18 can be tested (box 38) and, as necessary, removed and replaced (box 40) using a conventional reworking technique involving, for example, a hot plate and solder iron or a workstation that is specifically designed for reworking soldered components. Thus, for example, where the MCM 10 is complete and it is found that the underlying design is flawed with regard to the values or other characteristics of certain of the passive components 18, those passive components 18 can be easily removed and replaced to achieve a different performance or operation result.

It will be appreciated that the programmable MCMs 10 of the present invention can replace existing printed circuit or wiring board assemblies where customizable design capability is desired, and have use in any microcircuit applications in, for example, aerospace, automotive, computer, medical, and consumer electronics.

From the preceding description, it will be appreciated that the present invention provides a number of substantial advantages over the prior art, including, for example, segregating the active components 14 from the passive components 18, thereby facilitating removal and replacement of the passive components 18 and making the MCM 10 substantially programmable. This advantageous ability allows developers to test a variety of component values prior to committing to a finalized design, thereby shortening total design cycle time by minimizing circuit redesign and rebuild time. Furthermore, this segregation of components 14,18 facilitates shorter electrical interconnections to result in correspondingly improved performance for the active components 14.

Although the invention has been described with reference to the preferred embodiments illustrated in the attached drawings, it is noted that equivalents may be employed and substitutions made herein without departing from the scope of the invention as recited in the claims. It will be appreciated, for example, that the present invention is not limited to any particular type or nature of microcircuitry, active components, or passive components, nor does it preclude mounting or otherwise securing one or more active components and passive components in an intermingled and non-segregated manner on a same side of the substrate. Instead, the present invention is concerned primarily with achieving programmability of at least some of the passive components by segregating them from the hermetically sealed active components so that at least the segregated passive components can be removed and replaced as desired using conventional reworking techniques.

Having thus described the preferred embodiment of the invention, what is claimed as new and desired to be protected by Letters Patent includes the following:

1. A microcircuit comprising:
    a substrate having a first side and a second side;
    one or more active components secured to the first side of the substrate;
    a cover positioned over and substantially sealing the one or more active components; and
    one or more passive components secured to the second side of the substrate in such a manner so as to be removable and replaceable.
2. The microcircuit as set forth in claim 1, wherein the microcircuit is a multi-chip module.
3. The microcircuit as set forth in claim 1, wherein the substrate is a low-temperature co-fired ceramic.
4. The microcircuit as set forth in claim 1, wherein the one or more active components are selected from the group consisting of: integrated circuits, transistors, and diodes.
5. The microcircuit as set forth in claim 1, wherein the one or more passive components include one or more passive surface mount components.
6. The microcircuit as set forth in claim 5, wherein the one or more passive surface mount components are selected from the group consisting of:
    capacitors, resistors, inductors, and memory modules.
7. A microcircuit comprising:
    a substrate of low-temperature co-fired ceramic material having a first side and a second side;
    one or more active components wire-bonded to the first side of the substrate; and
    one or more passive components secured to the second side of the substrate in such a manner so as to be removable and replaceable.
8. The microcircuit as set forth in claim 7, wherein the microcircuit is a multi-chip module.
9. The microcircuit as set forth in claim 7, wherein the one or more active components are selected from the group consisting of: integrated circuits, transistors, and diodes.
10. The microcircuit as set forth in claim 7, wherein the one or more passive components are selected from the group consisting of: capacitors, resistors, inductors, and memory modules.
11. The microcircuit as set forth in claim 7, further including a cover positioned over and substantially sealing the one or more active components.
12. A microcircuit comprising:
    a substrate of low-temperature co-fired ceramic material having a first side and a second side;
    one or more active components secured to the first side of the substrate; and
    one or more passive components secured by reflow-soldering to the second side of the substrate so as to be removable and replaceable.
13. The microcircuit as set forth in claim 12, wherein the microcircuit is a multi-chip module.
14. The microcircuit as set forth in claim 12, wherein the one or more active components are selected from the group consisting of: integrated circuits, transistors, and diodes.
15. The microcircuit as set forth in claim 12, wherein the one or more passive components are selected from the group consisting of: capacitors, resistors, inductors, and memory modules.
16. The microcircuit as set forth in claim 12, further including a cover positioned over and substantially sealing the one or more active components.
17. A microcircuit comprising:
    a substrate of low-temperature co-fired ceramic material having a first side and a second side;
    one or more active components wire-bonded to the first side of the substrate;
    one or more passive components secured to the second side of the substrate in such a manner so as to be removable and replaceable; and
    one or more edge connectors electrically connecting the active components to the passive components.
18. The microcircuit as set forth in claim 17, wherein the microcircuit is a multi-chip module.
19. The microcircuit as set forth in claim 17, wherein the one or more active components are selected from the group consisting of: integrated circuits, transistors, and diodes.
20. The microcircuit as set forth in claim 17, wherein the one or more passive components are selected from the group consisting of: capacitors, resistors, inductors, and memory modules.

21. The microcircuit as set forth in claim 17, further including a cover positioned over and substantially sealing the one or more active components.

22. A microcircuit comprising:
- a substrate of low-temperature co-fired ceramic material having a first side and a second side;
- one or more active components wire-bonded to the first side of the substrate;
- one or more passive components secured to the second side of the substrate in such a manner so as to be removable and replaceable; and
- one or more vias electrically connecting the active components to the passive components through the substrate.

23. The microcircuit as set forth in claim 22, wherein the microcircuit is a multi-chip module.

24. The microcircuit as set forth in claim 22, wherein the one or more active components are selected from the group consisting of: integrated circuits, transistors, and diodes.

25. The microcircuit as set forth in claim 22, wherein the one or more passive components are selected from the group consisting of: capacitors, resistors, inductors, and memory modules.

26. The microcircuit as set forth in claim 22, further including a cover positioned over and substantially sealing the one or more active components.

* * * * *